(12) United States Patent
Ho et al.

(10) Patent No.: US 10,755,993 B2
(45) Date of Patent: Aug. 25, 2020

(54) ELECTRICAL CONNECTION STRUCTURE, SEMICONDUCTOR PACKAGE AND METHOD OF FORMING THE SAME

(71) Applicant: AGENCY FOR SCIENCE, TECHNOLOGY AND RESEARCH, Singapore (SG)

(72) Inventors: David Ho, Singapore (SG); Vempati Srinivasa Rao, Singapore (SG); Tai Chong Chai, Singapore (SG); Surya Bhattacharya, Singapore (SG)

(73) Assignee: AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 0 days.

(21) Appl. No.: 16/084,554

(22) PCT Filed: Mar. 16, 2017

(86) PCT No.: PCT/SG2017/050130
§ 371 (c)(1),
(2) Date: Sep. 12, 2018

(87) PCT Pub. No.: WO2017/160235
PCT Pub. Date: Sep. 21, 2017

(65) Prior Publication Data
US 2019/0080974 A1    Mar. 14, 2019

(30) Foreign Application Priority Data
Mar. 16, 2016  (SG) .............................. 10201602014P

(51) Int. Cl.
*H01L 23/31*  (2006.01)
*H01L 21/56*  (2006.01)
(Continued)

(52) U.S. Cl.
CPC ........ *H01L 23/3128* (2013.01); *H01L 21/565* (2013.01); *H01L 21/568* (2013.01);
(Continued)

(58) Field of Classification Search
CPC ... H01L 23/3128; H01L 24/16; H01L 21/565; H01L 23/49811; H01L 23/5389;
(Continued)

(56) References Cited

U.S. PATENT DOCUMENTS 4,940,181 A * 7/1990 Juskey, Jr. ............. B23K 1/203
                                                    228/180.21
6,242,932 B1  6/2001 Hembree
(Continued)

FOREIGN PATENT DOCUMENTS

KR    10-2015-0098936 A    8/2015

OTHER PUBLICATIONS

PCT International Search Report for PCT Counterpart Application No. PCT/SG2017/050130, 3 pgs. (dated Jun. 13, 2017).
(Continued)

*Primary Examiner* — David Vu
(74) *Attorney, Agent, or Firm* — Womble Bond Dickinson (US) LLP

(57) ABSTRACT

Various embodiments may provide an electrical connection structure. The electrical connection structure may include a first substrate having a first surface defining a cavity, and an inner wall defining a via extending from the cavity. The electrical connection structure may also include an interconnect structure provided in the via so that at least a portion of the interconnect structure protrudes into the cavity. The electrical connection structure may further include a second substrate having a second surface facing the first surface. The electrical connection structure may additionally include a connection element on the second surface. At least a
(Continued)

portion of the connection element may be received in the cavity so that the connection element is in electrical connection with the interconnect structure.

4 Claims, 16 Drawing Sheets

(51) Int. Cl.
    *H01L 23/498*     (2006.01)
    *H01L 23/538*     (2006.01)
    *H01L 25/00*     (2006.01)
    *H01L 23/00*     (2006.01)

(52) U.S. Cl.
    CPC .... *H01L 23/49811* (2013.01); *H01L 23/5389* (2013.01); *H01L 24/16* (2013.01); *H01L 25/00* (2013.01); *H01L 21/561* (2013.01); *H01L 24/13* (2013.01); *H01L 2224/13101* (2013.01); *H01L 2224/16225* (2013.01); *H01L 2224/97* (2013.01); *H01L 2924/14* (2013.01); *H01L 2924/15174* (2013.01); *H01L 2924/15311* (2013.01); *H01L 2924/15331* (2013.01); *H01L 2924/181* (2013.01)

(58) Field of Classification Search
    CPC .................. H01L 21/568; H01L 25/00; H01L 2924/15311; H01L 2924/181; H01L 2224/16225; H01L 2224/97; H01L 2924/15174; H01L 21/561
    See application file for complete search history.

(56) References Cited

U.S. PATENT DOCUMENTS

| | | | |
|---|---|---|---|
| 7,190,080 | B1 | 3/2007 | Leu et al. |
| 7,554,201 | B2 * | 6/2009 | Kang .................. B23K 35/025 257/772 |
| 8,395,568 | B2 | 3/2013 | Ray et al. |
| 8,779,601 | B2 | 7/2014 | Gan et al. |
| 2013/0037929 | A1 | 2/2013 | Essig et al. |
| 2013/0249106 | A1 | 9/2013 | Lin et al. |
| 2017/0053898 | A1 | 2/2017 | Yeh et al. |

OTHER PUBLICATIONS

PCT Written Opinion of the International Searching Authority for PCT Counterpart Application No. PCT/SG2017/050130, pp. 6 pgs. (dated Jun. 13, 2017).

PCT International Preliminary Report on Patentability for PCT Counterpart Application No. PCT/SG2017/050130, 20 pgs. (dated Mar. 15, 2018).

* cited by examiner

- Provide a first substrate having a first surface — 202
- Form a cavity on the first surface — 204
- Form an inner wall defining a via extending from the cavity — 206
- Form an interconnect structure in the via so that at least a portion of the interconnect structure protrudes into the cavity — 208
- Provide a second substrate having a second surface facing the first surface — 210
- Form a connection element on the second surface — 212

(c) Vertical interconnect formation (Cu wire or pillar)

(d) Chip 2 wafer assembly (e) Wafer level compression molding (f) Formation of hemispherical cavity on top of vertical interconnect & optional surface finishing (g) Wafer de-bond from glass wafer (h) Singulation & solder balls drop

ELECTRICAL CONNECTION STRUCTURE, SEMICONDUCTOR PACKAGE AND METHOD OF FORMING THE SAME

CROSS-REFERENCE TO RELATED APPLICATIONS

This patent application is a U.S. National Phase Application under 35 U.S.C. § 371 of International Application No. PCT/SG2017/050130, filed on 16 Mar. 2017, entitled ELECTRICAL CONNECTION STRUCTURE, SEMICONDUCTOR PACKAGE AND METHOD OF FORMING THE SAME, which claims the benefit of priority of Singapore Patent application No. 10201602014P, filed on 16 Mar. 2016, the contents of it were incorporated by reference in the entirety for all purposes.

TECHNICAL FIELD

Various aspects of this disclosure relate to electrical connection structures and/or methods of form electrical connection structures. Various aspects of this disclosure relate to semiconductor packages and/or methods of forming semiconductor packages.

BACKGROUND

Fan-out wafer level packaging is becoming more popular in recent years, due to low cost, good reliability and ease of multi-chips integration. Fan-out packages are widely adopted in mobile applications due to the low package profile because such packages do not involve the use of a ball grid array (BGA) substrate. First generation fan-out wafer level packages involve laterally connecting embedded chips using re-distribution layer (RDL) layers on the surrounding mold compound. Second generation and third generation of fan-out wafer level packages include vertical interconnects in the mold area for package on package (PoP) stacking application.

For mobile applications, the desirable package height should be lower than 1 mm. However, conventional PoP stacks are very high due to BGA substrate and thick solder balls used to connect top and bottom package. Fan-out wafer level packages have been effective in reducing the package height, but considerable efforts are required to further reduce the stacked package height.

SUMMARY

Various embodiments may provide an electrical connection structure. The electrical connection structure may include a first substrate having a first surface defining a cavity, and an inner wall defining a via extending from the cavity. The electrical connection structure may also include an interconnect structure provided in the via so that at least a portion of the interconnect structure protrudes into the cavity. The electrical connection structure may further include a second substrate having a second surface facing the first surface. The electrical connection structure may additionally include a connection element on the second surface. At least a portion of the connection element may be received in the cavity so that the connection element is in electrical connection with the interconnect structure.

Various embodiments may provide a method of forming an electrical connection structure. The method may include providing a first substrate having a first surface. The method may also include forming a cavity on the first surface. The method may further include forming an inner wall defining a via extending from the cavity. The method may additionally include forming an interconnect structure in the via so that at least a portion of the interconnect structure protrudes into the cavity. The method may further include providing a second substrate having a second surface facing the first surface. The method may also include forming a connection element on the second surface. At least a portion of the connection element may be received in the cavity so that the connection element is in electrical connection with the interconnect structure.

BRIEF DESCRIPTION OF THE DRAWINGS

The invention will be better understood with reference to the detailed description when considered in conjunction with the non-limiting examples and the accompanying drawings, in which:

FIG. 2 shows a schematic of a method of forming an electrical connection structure according to various embodiments.

DETAILED DESCRIPTION

Figure 1:
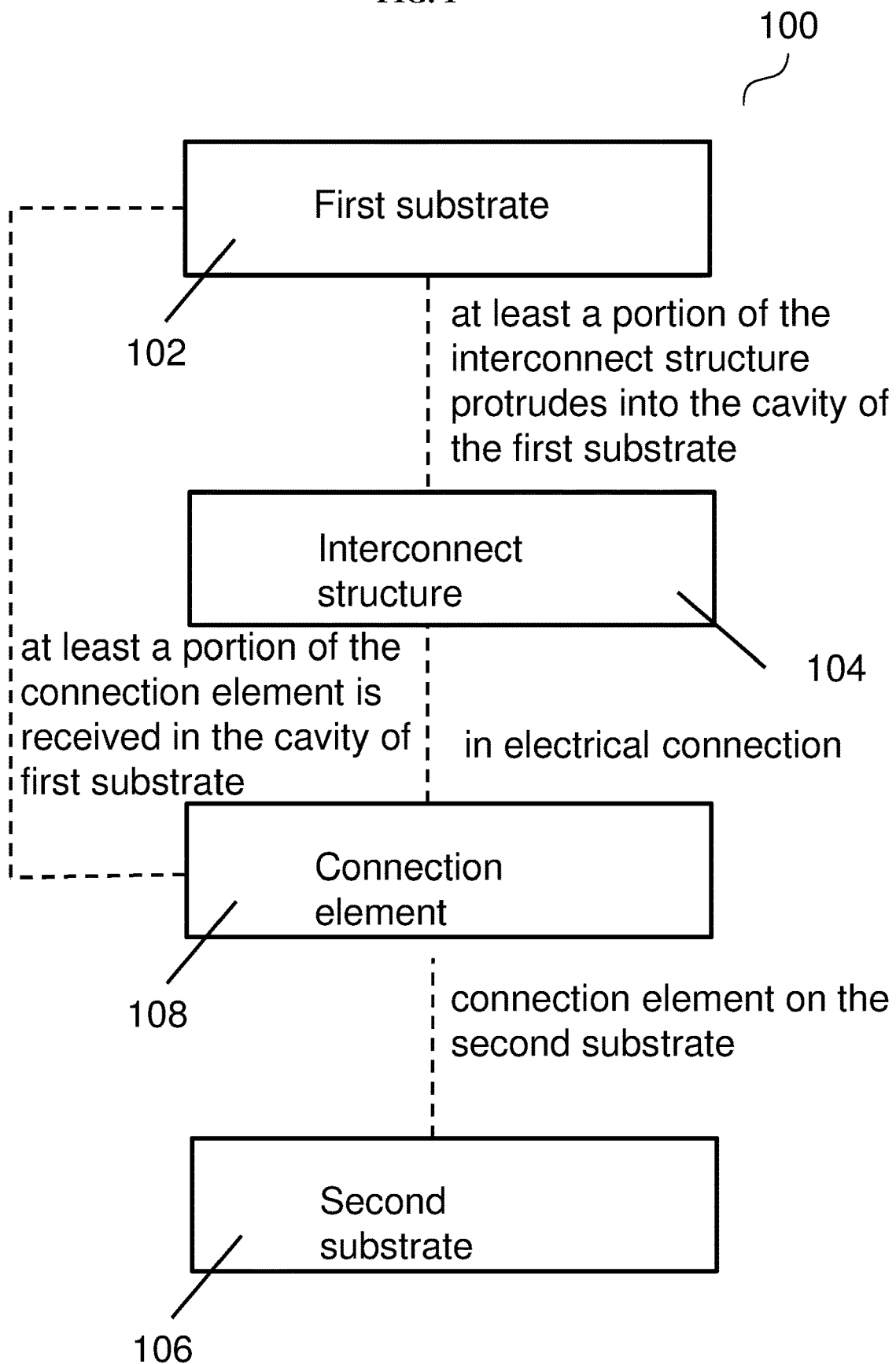
FIG. 1 is a general illustration of an electrical connection structure according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or structures/packages are analogously valid for the other methods or structures/packages. Similarly, embodiments described in the context of a method are analogously valid for a structure/package, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may also be used herein to mean that the deposited material may be formed "indirectly on" the implied side or surface with one or more additional layers being arranged between the implied side or surface and the deposited material. In other words, a first layer "over" a second layer may refer to the first layer directly on the second layer, or that the first layer and the second layer are separated by one or more intervening layers.

The structure/package as described herein may be operable in various orientations, and thus it should be understood that the terms "top", "bottom", etc., when used in the following description are used for convenience and to aid understanding of relative positions or directions, and not intended to limit the orientation of the structure/package.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

For the sake of clarity and to avoid clutter, not all features in some of the figures have been labelled. Features which are similar to features that have already been labelled may not be labelled to improve clarity and to avoid clutter.

One area of improvement is to reduce solder ball interconnect height between the package top and the bottom package.

FIG. 1 is a general illustration of an electrical connection structure 100 according to various embodiments. The electrical connection structure 100 may include a first substrate 102 having a first surface defining a cavity, and an inner wall defining a via extending from the cavity. The electrical connection structure 100 may also include an interconnect structure 104 provided in the via so that at least a portion of the interconnect structure 104 protrudes into the cavity. The electrical connection structure 100 may further include a second substrate 106 having a second surface facing the first surface. The electrical connection structure 100 may additionally include a connection element 108 on the second surface. At least a portion of the connection element 108 may be received in the cavity so that the connection element 108 is in electrical connection with the interconnect structure 104.

In other words, the electrical connection structure 100 may include a first substrate 102 having a cavity containing an end portion of the interconnect structure 104, and a second substrate 106 with a connection element 108, which is received by the cavity of the first substrate 102 and which connects with the interconnect structure 104.

Various embodiments may mitigate or address the above-mentioned problems.

Various embodiments may reduce solder ball interconnect height between the package top and the bottom package.

In various embodiments, the cavity may be a hemispherical cavity. The hemispherical cavity may be of a perfect hemisphere or may not be of a perfect hemisphere. For instance, the depth of the hemispherical cavity may be slightly greater or slightly smaller than a lateral radius of the hemispherical cavity. The imperfect hemispherical shape may arise due to the fabrication process. In various embodiments, the cavity may be of any other suitable shape.

The first surface may include a substantially planar first portion, and a second portion defining the cavity. The second portion may adjoin the first portion, and the first portion and the second portion to define a continuous surface, i.e. the first surface. The second portion may be concave to define the hemispherical cavity.

The first substrate 102 may include or may be a mold encapsulation structure. The cavity and the via may be defined in the mold encapsulation structure.

In various embodiments, the interconnect structure 104 may extend vertically into the cavity. The interconnect structure 104 may be electrically conductive. The interconnect structure 104 may be a pillar or a wire. The interconnect structure 104 may include an electrically conductive material, for instance a metal such as copper.

The connection element 108 may include or be solder.

In various embodiments, the electrical connection structure 100 may further include an interconnect finishing layer on or over the portion of the interconnect structure 104 protruding into the cavity. The interconnect finishing layer may include one or more elements selected from a group consisting of copper, nickel, gold and palladium. The one or more elements may be deposited onto the portion of the interconnect structure protruding into the cavity via electroless plating and/or immersion plating. For instance, gold and/or palladium may be plated by immersion plating, while nickel and/or palladium may be deposited by electroless plating. The interconnect finishing layer may be an electroless nickel immersion gold (ENIG) plating or an electroless nickel immersion palladium immersion gold (ENIPIG) plating.

In various embodiments, the electrical connection structure 100 may further include a cavity finishing layer on at least a portion of the first surface defining the cavity. The cavity finishing layer may also extend to on or over the portion of the interconnect structure 104 protruding into the cavity. The cavity finishing layer may include one or more elements selected from a group consisting of copper, nickel, palladium and gold. The cavity finishing layer may include a seed layer in contact with the first substrate 102 (and the portion of the interconnect structure 104 protruding into the cavity) and an under bump metallization (UBM) on the seed layer.

The via may extend from the cavity to a further surface of the first substrate opposite the first surface. The via may be a through mold via. The interconnect structure 104 may also extend from within the cavity to at least the further surface.

The second substrate 106 may include a mold encapsulation structure. The second substrate 106 may also include a redistribution layer defining the second surface of the second substrate 106. The redistribution layer may include an under bump metallization in contact with the connection element 108.

Various embodiments may provide a semiconductor package including the electrical connection structure 100 as described herein. The electrical connection structure 100 may include a first substrate 102 having a first surface defining a cavity, and an inner wall defining a via extending from the cavity. The electrical connection structure 100 may also include an interconnect structure 104 provided in the via so that at least a portion of the interconnect structure 104 protrudes into the cavity. The electrical connection structure 100 may further include a second substrate 106 having a second surface facing the first surface. The electrical connection structure 100 may additionally include a connection element 108 on the second surface. At least a portion of the connection element 108 may be received in the cavity so that the connection element 108 is in electrical connection with the interconnect structure 104.

The first substrate 102 may include a first semiconductor die. The first substrate 102 may further include a first redistribution layer in electrical connection with the first semiconductor die. The first substrate 102 may also include a first mold encapsulation structure on or over the first redistribution layer, the first mold encapsulation structure encapsulating the first semiconductor die. The first substrate 102 may further include a plurality of solder bumps in electrical connection with the first redistribution layer. The plurality of solder bumps and the first mold encapsulation structure may be on opposite sides of the first redistribution layer.

In the present context, a mold encapsulation structure encapsulating a semiconductor die may refer to the mold encapsulation structure in contact or covering the semiconductor die. In various embodiments, the mold encapsulating structure may partially, substantially, or completely cover or surround the semiconductor die.

The second substrate 106 may include a second semiconductor die. The second substrate 106 may further include a second redistribution layer in electrical connection with the second semiconductor die. The second substrate 106 may also include a second mold encapsulation structure on the second redistribution layer, the second mold encapsulation structure encapsulating the second semiconductor die.

In various embodiments, the first surface may be defined on the first mold encapsulation structure of the first substrate 102. The second surface may be defined on the second redistribution layer of the second substrate 106.

In various embodiments, the first redistribution layer may include one or more conductive elements. The interconnect structure 104 may be in electrical connection with the one or more conductive elements in the first redistribution layer. The interconnect structure 104 may extend from the first redistribution layer through the first mold encapsulation structure to the connection element 108. The connection element 108 may be in electrical connection with the second redistribution layer.

The semiconductor package may be a package on package (PoP) structure.

FIG. 2 shows a schematic 200 of a method of forming an electrical connection structure according to various embodiments. The method may include, in 202, providing a first substrate having a first surface. The method may also include, in 204, forming a cavity on the first surface. The method may further include, in 206, forming an inner wall defining a via extending from the cavity. The method may additionally include, in 208, forming an interconnect structure in the via so that at least a portion of the interconnect structure protrudes into the cavity. The method may further include, in 210, providing a second substrate having a second surface facing the first surface. The method may also include, in 212, forming a connection element on the second surface. At least a portion of the connection element may be received in the cavity so that the connection element is in electrical connection with the interconnect structure.

In other words, the method may include forming an electrical connection structure as described herein. The method may include creating a cavity in a first substrate, forming an interconnect structure in the first substrate so that the interconnect structure protrudes into the cavity. The method may also include forming a connection element on a second substrate, so that the cavity receives the connection element, and the connection element is in electrical connection with the interconnect structure.

The steps shown in FIG. 2 may not be in sequence. For instance, the cavity may be formed after forming the interconnect structure.

The cavity may be formed by laser machining. The cavity may be hemispherical.

The method may also include bringing the first substrate and the second substrate together so that at least the portion of the connection element is received in the cavity.

The method may further include forming an interconnect finishing layer on the portion of the interconnect structure protruding into the cavity by using one of electroless plating and immersion plating.

The method may additionally or alternatively include forming a cavity finishing layer on at least a portion of the first surface defining the cavity by using at least one of sputtering and plating (e.g. electroplating). In various embodiments, the method may include disposition or forming of a seed layer within the cavity and on the first surface, i.e. the second portion of the first surface defining the cavity. The method may further include forming of an underbump metallization (UBM) layer on the seed layer by electroplating.

Various embodiments may provide forming a semiconductor package as described herein. The semiconductor package may be a PoP structure.

The method may include forming a first redistribution layer (e.g. on or over a carrier). The method may include providing or forming a first semiconductor die on or over the first redistribution layer so that the first redistribution layer is in electrical connection with the first semiconductor die. The method may also include forming an interconnect structure so that the interconnect structure is in electrical connection with the first redistribution layer. The method may include forming a first mold encapsulation structure on or over the first redistribution layer, the first mold encapsulation structure encapsulating the first semiconductor die. The first mold encapsulation structure may further encapsulate or cover the first interconnect structure. The method may additionally include forming a cavity on the first substrate so that at least a portion of the first interconnect structure protrudes into the cavity. The method may also include separating a molded structure or wafer (including the first redistribution layer, the first semiconductor die, the first interconnect structure and the first mold encapsulation structure) from the carrier. The first redistribution layer, the first semiconductor die, and the first mold encapsulation structure may form or be comprised in the first substrate. The interconnect structure may be provided in a via defined in an inner wall of the first substrate, and a portion of the interconnect structure may protrude into the cavity.

The method may include forming a second redistribution layer (e.g. on or over another carrier). The method may include providing or forming a second semiconductor die on or over the second redistribution layer so that the second redistribution layer is in electrical connection with the second semiconductor die. The method may include forming a second mold encapsulation structure on or over the second redistribution layer, the second mold encapsulation structure encapsulating the second semiconductor die. The method may also include separating a further molded structure or wafer (including the second redistribution layer, the second semiconductor die, and the second mold encapsulation structure) from the carrier. The method may additionally include forming the connection element, e.g. a solder ball, on the second redistribution structure. The connection element and the mold encapsulation structure may be on opposite sides of the redistribution layer. The connection element may be in electrical connection with the second redistribution structure. The second redistribution layer, the second semiconductor die, and the second mold encapsulation structure may be formed or may be comprised in the second substrate. The connection element may be on a surface of the second substrate.

The method may additionally include bringing the first substrate and the second substrate together so that at least a portion of the connection element is received in the cavity and the connection element is in electrical connection with the interconnect structure.

Figure 3A:
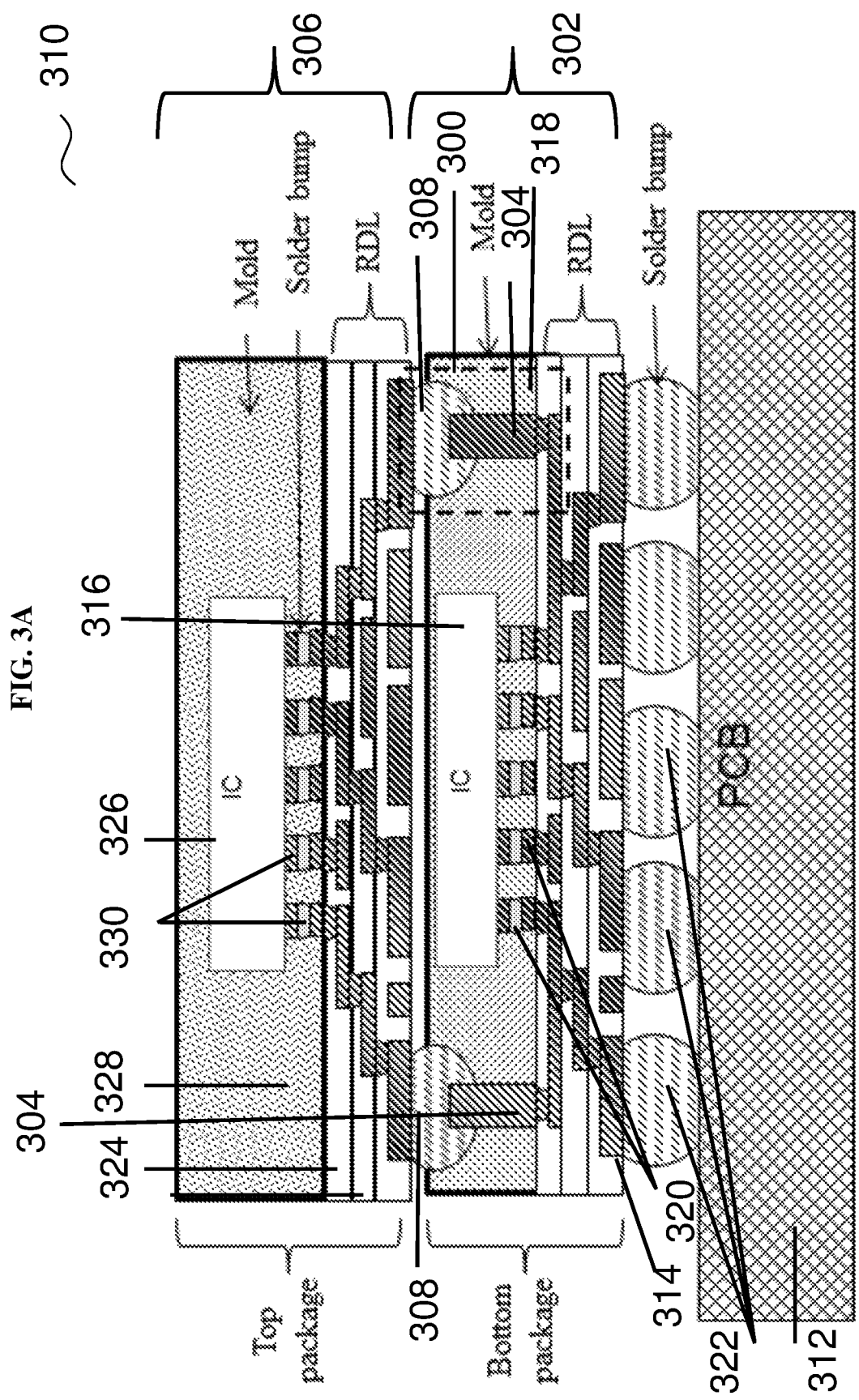
FIG. 3A is a cross-sectional schematic of a semiconductor package according to various embodiments.

FIG. 3A is a cross-sectional schematic of a semiconductor package 310 according to various embodiments. The semiconductor 310 may be a package on package (PoP) structure, and may include a bottom package, and a top package over the bottom package. The semiconductor package 310 may be attached to a printed circuit board (PCB) 312.

The bottom package may include a first substrate 302. The first substrate 302 may include a first redistribution layer (RDL) 314, a first semiconductor die 316 (which may be referred to as integrated circuit (IC) chip), and the first mold encapsulation structure 318 (which may be referred to as mold). The first mold encapsulation structure 318 may include mold epoxy.

The first redistribution layer 314 may include one or more metallizations, and one or more dielectric layers embedding or covering the one or more metallizations. The first semiconductor die 316 may be electrically connected to the first redistribution layer 314, i.e. the one or more metallization, via one or more one or more contact structures such as solder bumps 320. Solder bumps 322 may be formed on the redistribution layer 314. The solder bumps 322 may be attached to the PCB 312 and may provide electrical connection between the PCB 312 and the bottom package. Only two of the solder bumps 320 and three of the solder bumps 322 are labelled in FIG. 3A to avoid clutter and improve clarity. The first mold encapsulation structure 318 may encapsulate or surround the first semiconductor die 316 and one or more interconnect structures 304, which may be referred to as through mold interconnects (TMIs).

The top package may be or may include a second substrate 306. The second substrate 306 may include the second redistribution layer (RDL) 324, the second semiconductor die 326 (which may be referred to as integrated circuit (IC) chip), and the second mold encapsulation structure 328 (which may be referred to as mold). The second mold encapsulation structure 328 may include mold epoxy.

Similar to the first redistribution layer 314, the second redistribution layer 324 may include one or more metallizations, and one or more dielectric layers embedding or covering the one or more metallizations. The second semiconductor die 326 may be electrically connected to the second redistribution layer 324, i.e. the one or more metallization, via one or more one or more contact structures such as solder bumps 330. Only two of the solder bumps 330 have been labelled in FIG. 3A to avoid clutter and improve clarity. The second mold encapsulation structure 328 may encapsulate or surround the second semiconductor die 326.

Connection elements 308 such as solder bumps may be formed on the second redistribution layer 324, and may be electrically connected to the second redistribution layer 324, i.e. the metallizations of the second redistribution layer 324. The connection elements 308 may be received in the cavities of the first substrate 302 or the bottom package, and may be in electrical connection with the one or more interconnect structures 304.

The first semiconductor chip 316, the second semiconductor chip 326, and the PCB 312 may be in electrical connection with one another via solder bumps 308, 320, 330, 322, metallizations in RDLs 314, 324, and the one or more interconnect structures 304.

The dashed box shown in FIG. 3A indicates an electrical connection structure 300 according to various embodiments.

Figure 3B:
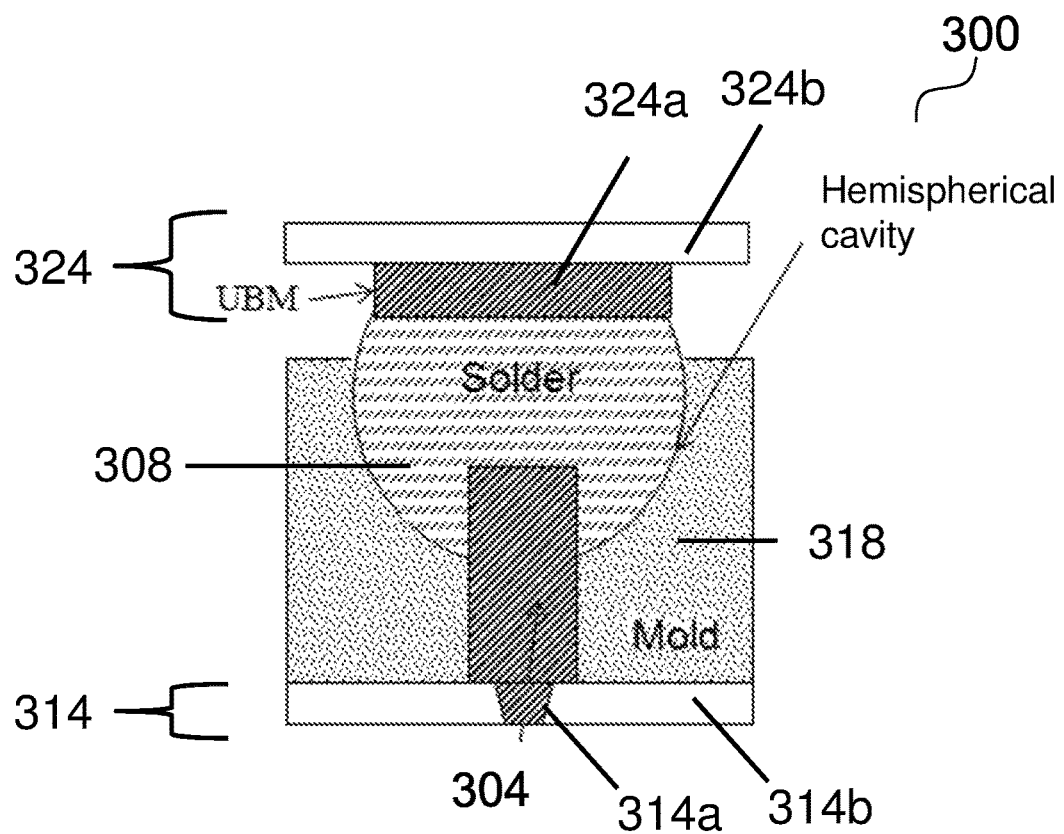
FIG. 3B shows the electrical connection structure according to various embodiments.
Figure 3C:
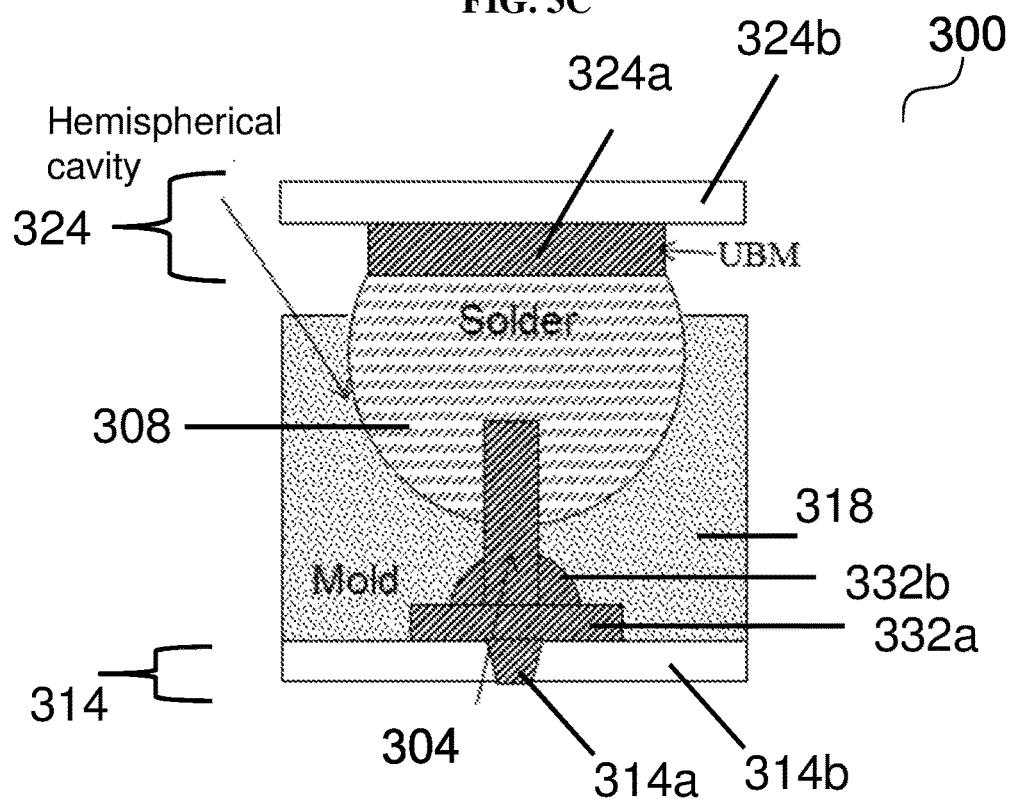
FIG. 3C shows the electrical connection structure according to various other embodiments.

FIG. 3B shows the electrical connection structure 300 according to various embodiments. FIG. 3C shows the electrical connection structure 300 according to various other embodiments. As shown in FIGS. 3B and 3C, the second redistribution layer 324 may include an under bump metallization (UBM) 324a, and the solder bump 308 may be on the under bump metallization 324a. The under bump metallization 324a may be on a dielectric layer 324b, but may be in electrical connection with other metallizations present in the second redistribution layer 324.

The solder bump 308 may be received in a hemispherical cavity defined by an inner wall of the first mold encapsulation structure 318. The first mold encapsulation structure 318 may be on the first redistribution layer 314, which may include metallization 314a and dielectric layer 314b.

FIG. 3B shows that the connection structure 304 may be a conductive pillar such as a copper pillar or a copper electro-plated pillar, while FIG. 3C shows that the connection structure 304 may be a conductive wire or wire-bond, such as a copper wire. The connection structure 304 may be in electrical connection with metallization 314a. As shown in FIGS. 3B, 3C, at least a portion of the connection structure 304 may protrude into the cavity. The connection structure 304 may form a metallic joint or intermetallic joint with the solder bump 308. The solder bump 308 may form the intermetallic joint with the exposed metal comprised in the connection structure 304 during assembly reflow process.

The conductive wire 304 shown in FIG. 3C may be metallically bonded on a wire-bondable surface such as a conductive pad 332a (e.g. aluminum pad with or without gold finish, or copper pad with or without gold finish) using wire ball bonding material 332a, with one end of the conductive wire 332a standing on the conductive pad 332a so that the conductive wire 304 is in a vertical position.

The solder bump 308 may fill in the hemispherical cavity and may reduce the package gap between the top package and the bottom package, hence decreasing the stacked package height. The hemispherical cavity may also prevent solder bridging of adjacent solder balls. Further, since the hemispherical cavity encloses the solder bump 308, the reliability of the joint between the solder bump 308 and the interconnect structure 304 may be improved. During thermal cycling, a solder crack that forms may be diverted to the protruding portion of the vertical interconnect 304 and may be impeded by the vertical interconnects. The interconnect structure 304 may include a material such as copper (Cu) that is harder than solder, which allows the interconnect structure 304 to impede the propagation of the crack.

In addition, as the embedded vertical interconnect structure 304 does not need to extend over the entire thickness of the mold epoxy, the process of fabricating the vertical interconnect 304 may also be less demanding.

Figure 3D:
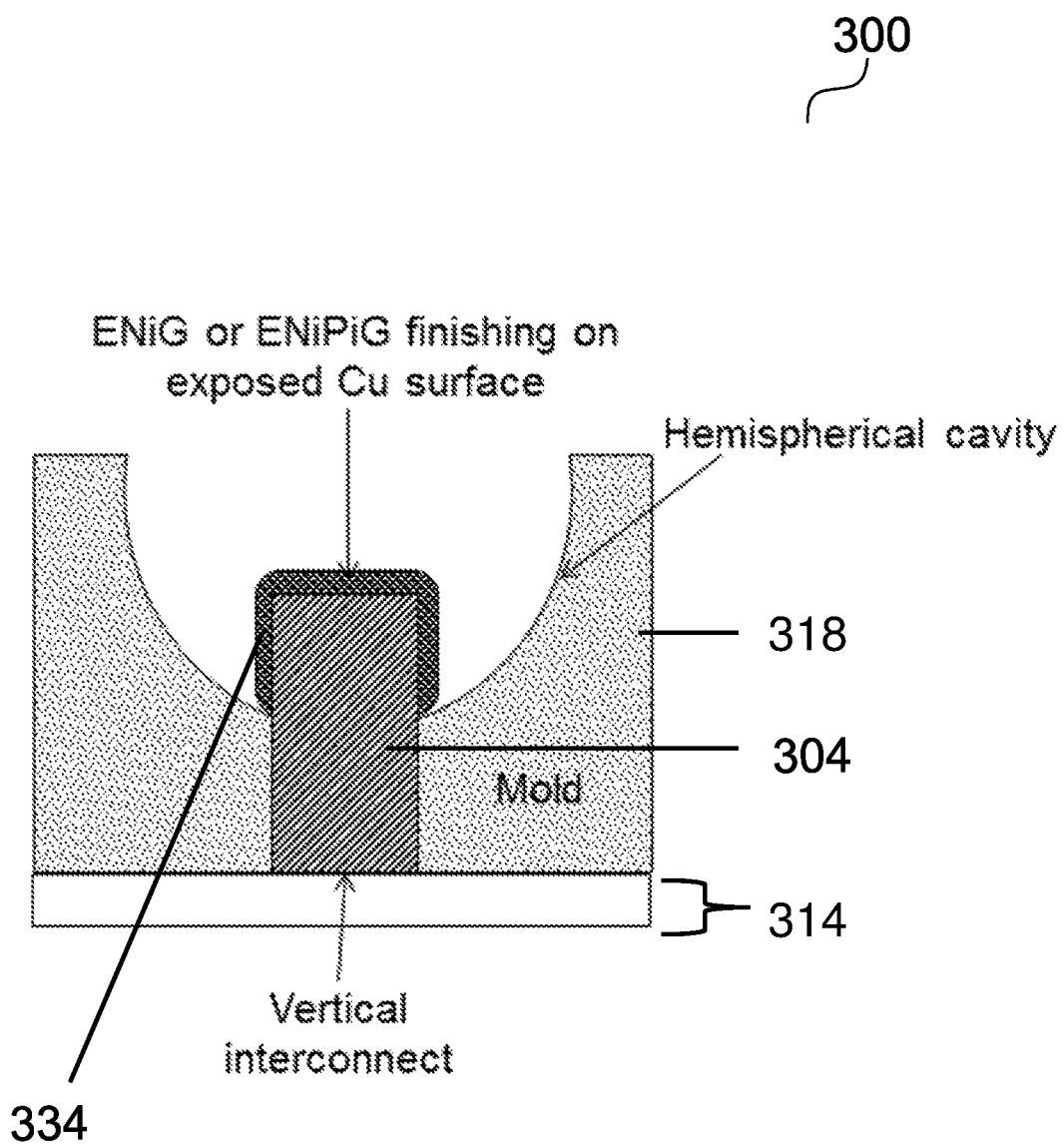
FIG. 3D shows the electrical connection structure including an interconnect finishing layer on the portion of the interconnect structure protruding into the cavity according to various embodiments.

FIG. 3D shows the electrical connection structure 300 including an interconnect finishing layer 334 on the portion of the interconnect structure 304 protruding into the cavity according to various embodiments. Nickel (Ni) and/or palladium (Pd) may be deposited over the portion of the interconnect structure 304 by electroless plating, while palladium (Pd) and/or gold (Au) may be deposited over the portion of the interconnect structure 304 by immersion plating. The Pd metal and/or the Ni metal may act as a diffusion barrier to improve the solder joint reliability, while the Au metal may act as an oxidation protective layer to help improve solder wetting in assembly reflow process.

Figure 3E:
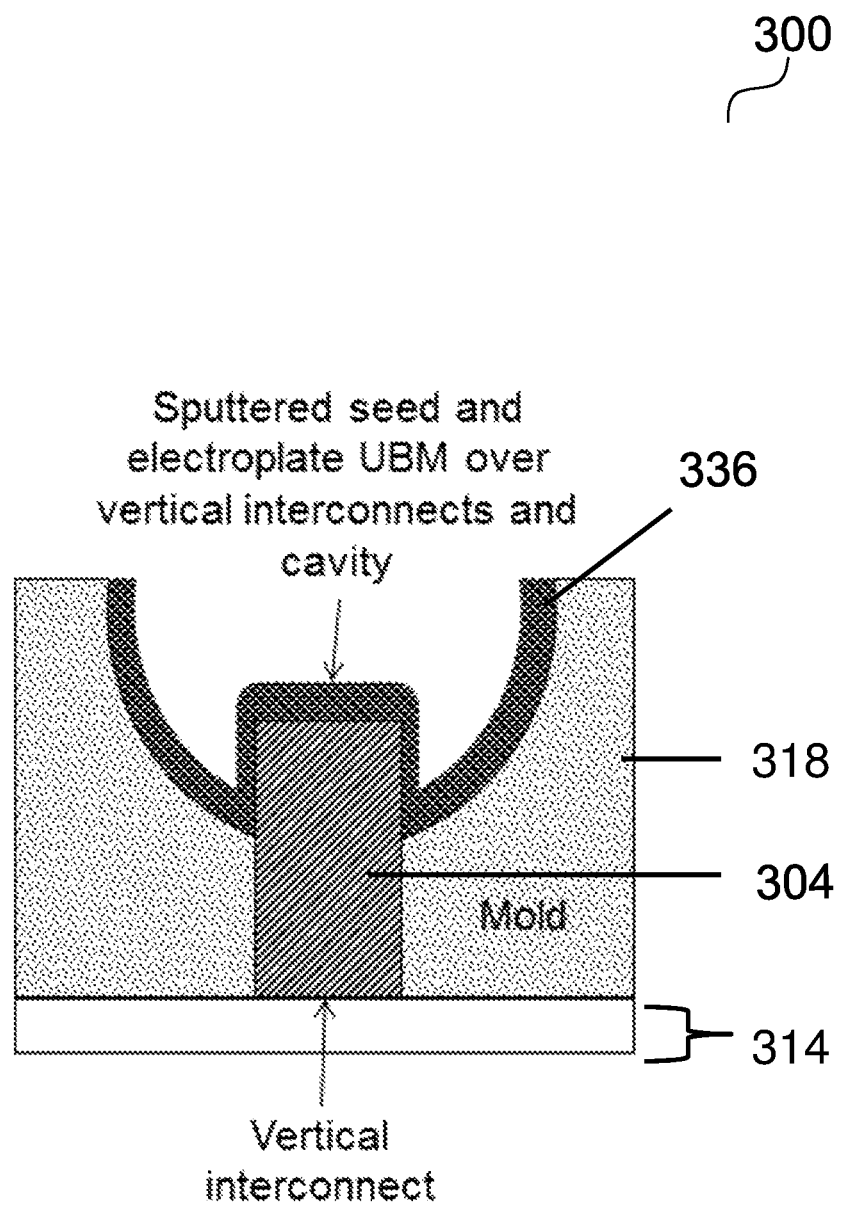
FIG. 3E shows the electrical connection structure including a cavity finishing layer on at least a portion of the first surface defining the cavity according to various other embodiments.

FIG. 3E shows the electrical connection structure 300 including a cavity finishing layer 336 on at least a portion of the first surface defining the cavity according to various other embodiments. A seed layer including nickel, palladium and/or gold may be sputtered onto the sidewall defining the cavity as well as onto the portion of the interconnect structure 304 protruding into the cavity. An under bump metallization (UBM) layer may also be formed on the seed layer and over the sidewall as well as the portion of the interconnect 304. The UBM layer may include copper, nickel, palladium, and/or gold. The cavity finishing layer 336 may include the seed layer and the UBM layer. The cavity finishing layer 336 may improve the solder joint reliability as the layer may remove or reduce gaps along the interfaces. There may be few or no gaps along the interface between the first mold encapsulation structure 318 and the UBM or the interface between the UBM and the solder bump 308 after reflow. The gap-less hemispherical solder interface may behave like an underfill encapsulation.

Figure 4:
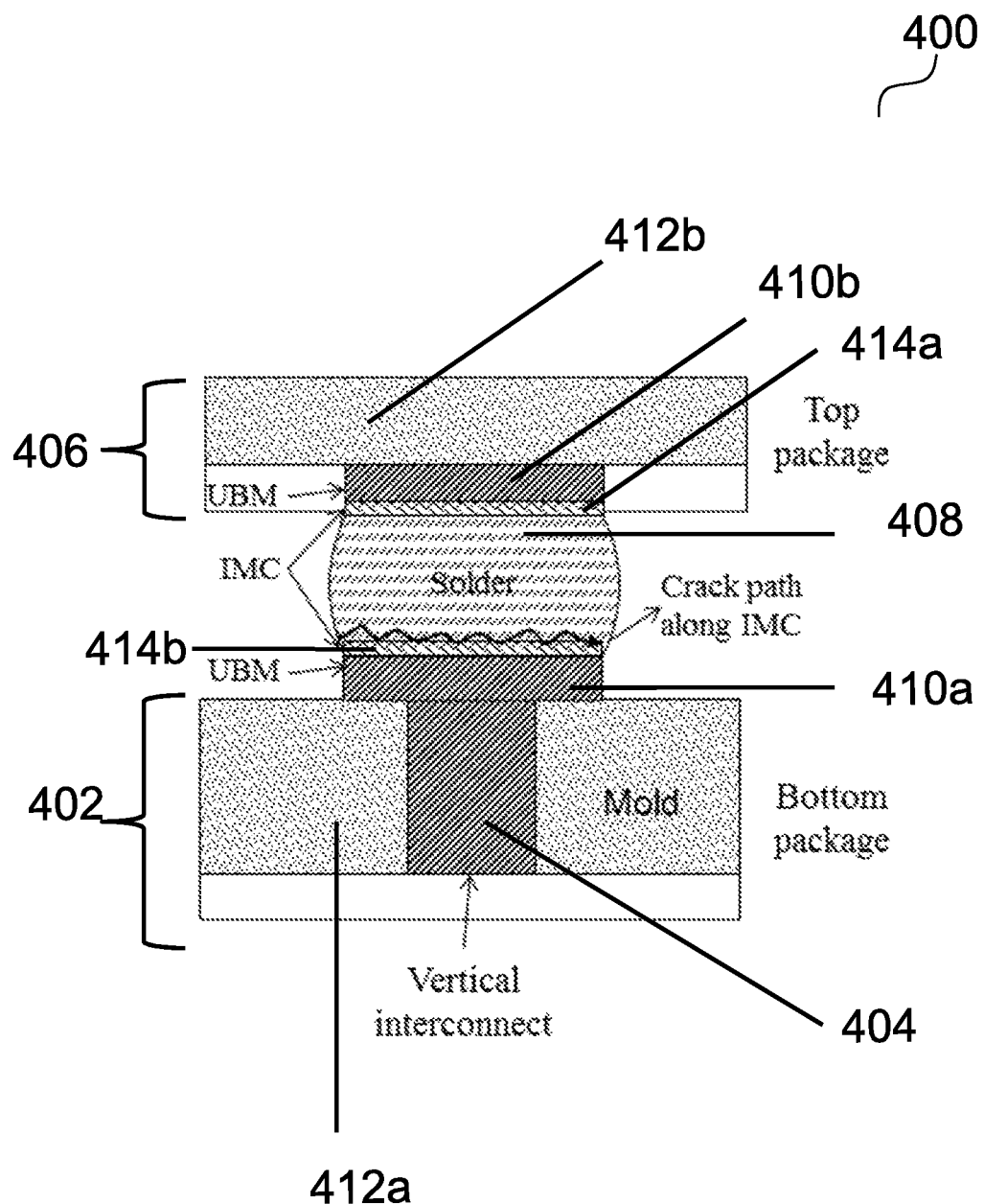
FIG. 4 is a cross-sectional schematic of a solder joint connection of a conventional package on package (PoP) structure.

FIG. 4 is a cross-sectional schematic of a solder joint connection 400 of a conventional package on package (PoP) structure. The PoP structure may include a bottom package 402 including a vertical interconnect 404, and a top package 406 with solder bump 408. The bottom package 402 may also include a mold encapsulation structure 412a covering the vertical interconnect 404, and an under bump metallization 410a in electrical connection with the vertical interconnect 404. The top package 406 may include may also include a mold encapsulation structure 412b and an under bump metallization 410b.

There may be intermetallic compound (IMC) layers 414a, 414b formed between the solder bump 408 and the under bump metallizations 410a, 410b. Cracks may start at the brittle IMC layers 414a, 414b, and may propagate along the IMC layers 414a, 414b until the entire solder joint connection 400 breaks off or fails.

Figure 5A:
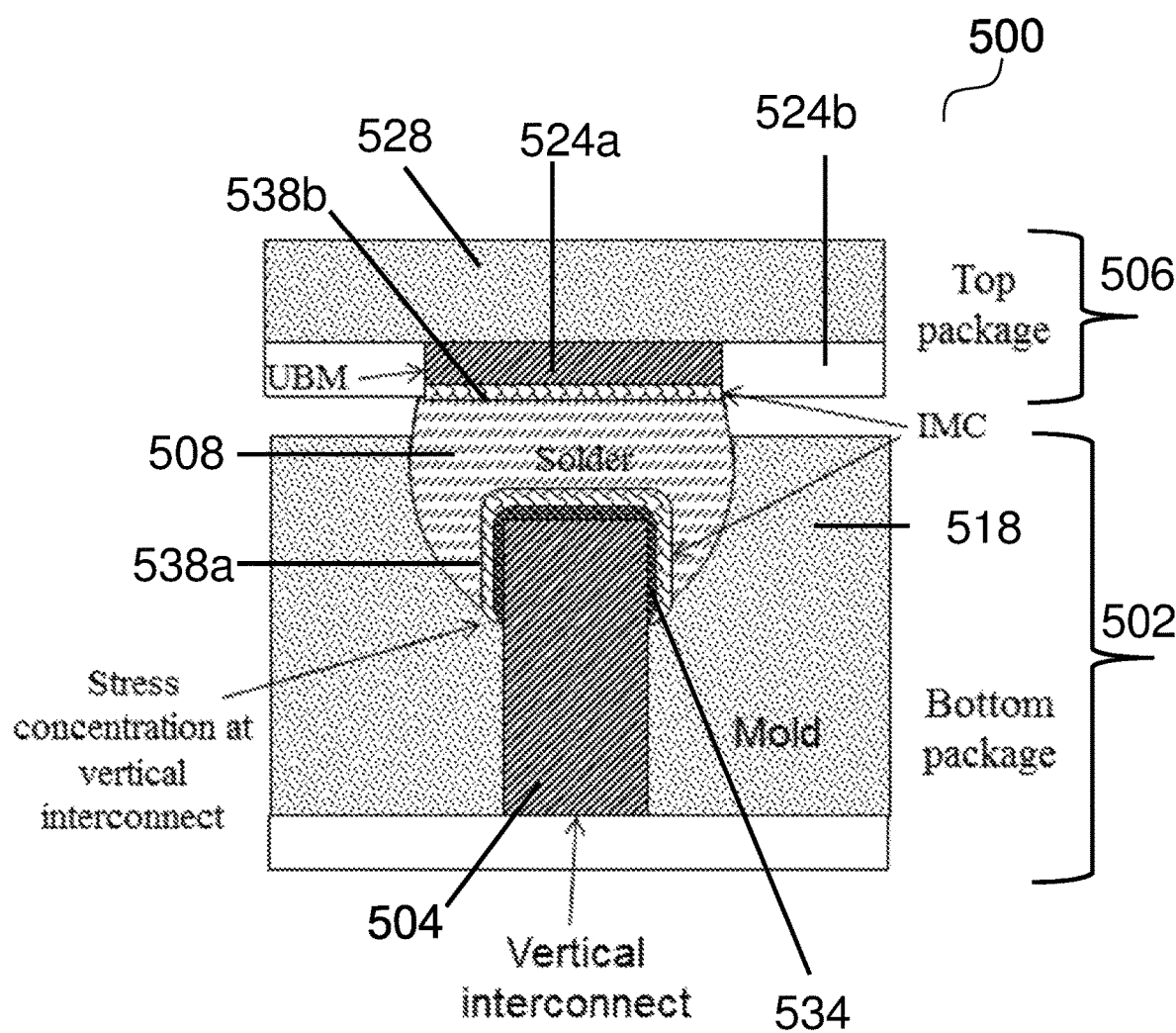
FIG. 5A is a cross-sectional schematic of an electrical connection structure according to various embodiments.

FIG. 5A is a cross-sectional schematic of an electrical connection structure 500 according to various embodiments. The electrical connection structure 500 may include a first substrate 502 or bottom package having a first surface defining a hemispherical cavity, and an inner wall defining a via extending from the cavity. The cavity and via may be defined in a first mold encapsulation structure 518. The electrical connection structure 500 may also include an interconnect structure 504 provided in the via so that at least a portion of the interconnect structure 504 protrudes into the cavity. The electrical connection structure may further include an interconnect finishing layer 534 on the portion of the interconnect structure 504 protruding into the cavity.

The electrical connection structure 500 may further include a second substrate 506 having a second surface facing the first surface. The top package may be or may include the second substrate 506 The electrical connection structure 500 may additionally include a connection element 508 on the second surface. The second substrate 506 may include a under bump metallization 524a, and the second surface may be a surface of the under bump metallization 524a. The second substrate 506 may also include a dielectric layer 524b.

At least a portion of the connection element 508 may be received in the cavity so that the connection element 508 is in electrical connection with the interconnect structure 504. The interconnect finishing layer 534 may be electrically conductive.

A first intermetallic compound (IMC) layer 538a may be formed along an interface between the interconnect finishing layer 534 and the connection element 508. The layer 538a may be formed from materials comprised in the connection element 508, the interconnect finishing layer 534 and/or the interconnect structure 504. A second intermetallic compound (IMC) layer 538b may be formed along an interface between the under bump metallization 524a and the connection element 508. The layer 538b may be formed from materials comprised in the connection element 508 and the under bump metallization 524a.

Stress may be concentrated at the edge of the first IMC layer 538a and the crack path may start at the edge of layer 538 where the stress concentration may be the highest. The crack path may be stopped by the protruding portion of the interconnect structure 504.

The interconnect structure 504 may include copper (Cu) which is harder than solder or the IMC material, and may stop the crack from propagating through the solder joint, thus increasing solder joint reliability.

Figure 5B:
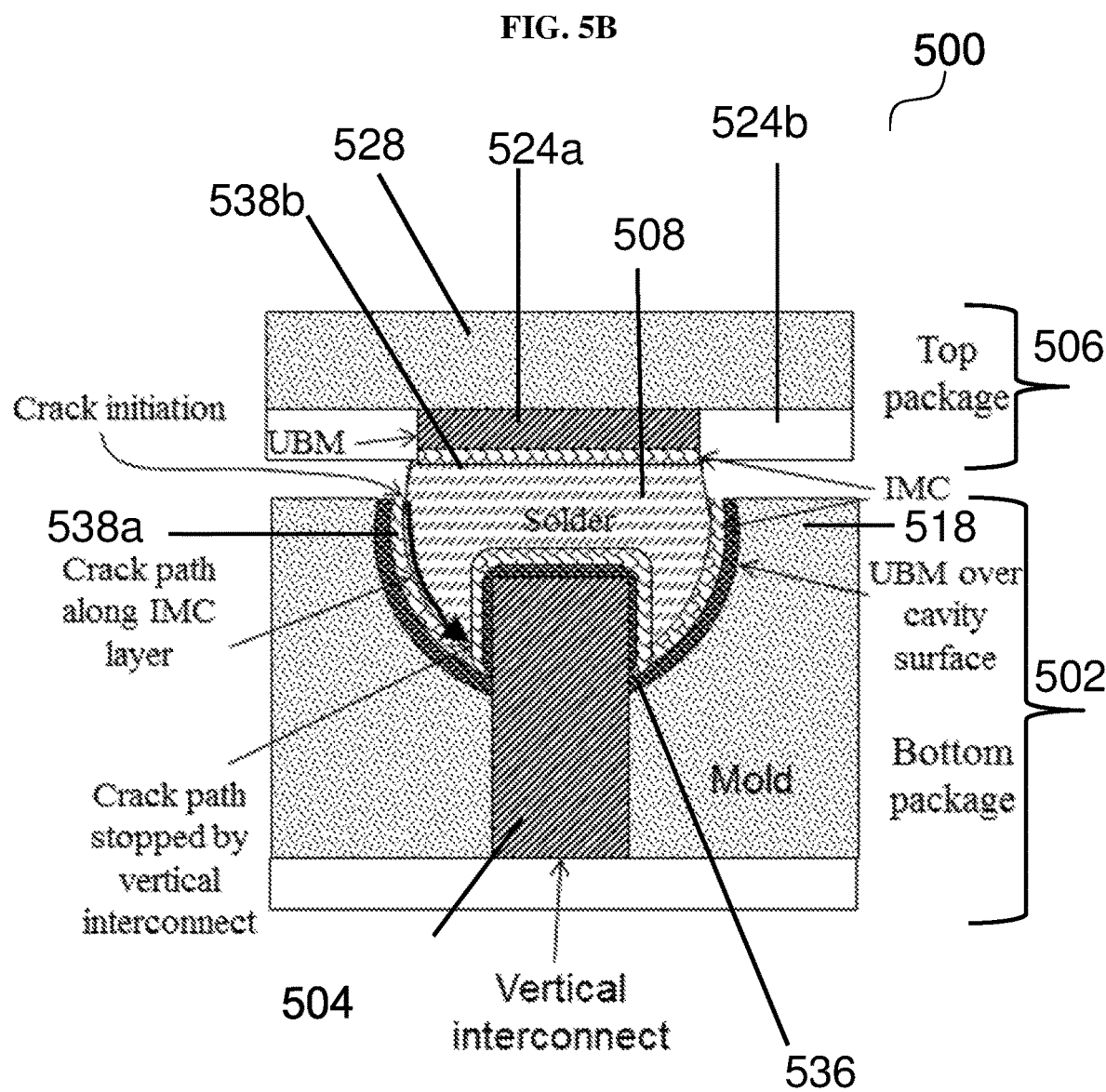
FIG. 5B is a cross-sectional schematic of an electrical connection structure according to various other embodiments.

FIG. 5B is a cross-sectional schematic of an electrical connection structure 500 according to various other embodiments. Instead of the interconnect finishing layer 534, the electrical connection structure 500 may include a cavity finishing layer 536 on at least a portion of the first surface defining the cavity. The cavity finishing layer 536 may include an under bump metallization (UBM). The cavity finishing layer 536 may also extend onto the protruding portion of the interconnect structure 504. The first intermetallic compound (IMC) layer 538a may be formed along an interface between the connection element 508 and the protruding portion of the interconnect structure 504 as well as the portion of the first surface defining the cavity. The IMC layer 538a may be formed from the connection layer 508, the cavity finishing layer 536, and/or the interconnect structure 504.

The crack may start at the edge of the first intermetallic compound (IMC) layer 538a where the stress concentration is the highest. The crack may propagate along the IMC layer 538a along the hemispherical cavity, and may be stopped by the interconnect structure 504. The cavity finishing layer 536 may include a diffusion barrier which retards the growth of the IMC layer 538a, which may further improve reliability.

FIGS. 6A-I show a method of forming a semiconductor package according to various embodiments. Hemispherical through mold interconnects may be formed in a fan-out wafer level package.

Figure 6A:
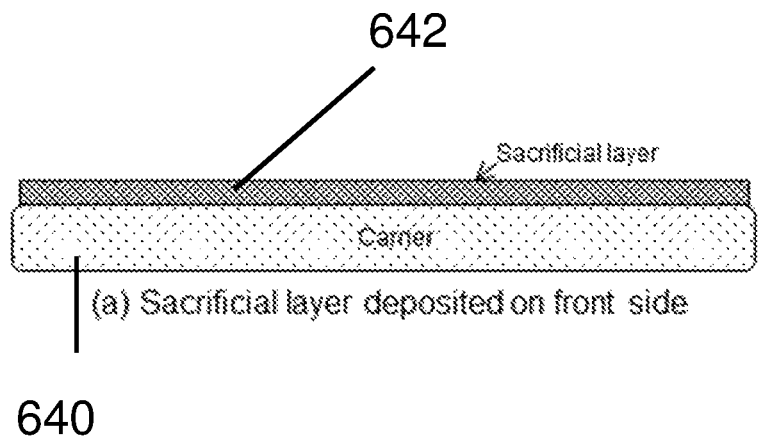
FIG. 6A shows forming a sacrificial layer on or over a carrier according to various embodiments.
Figure 6B:
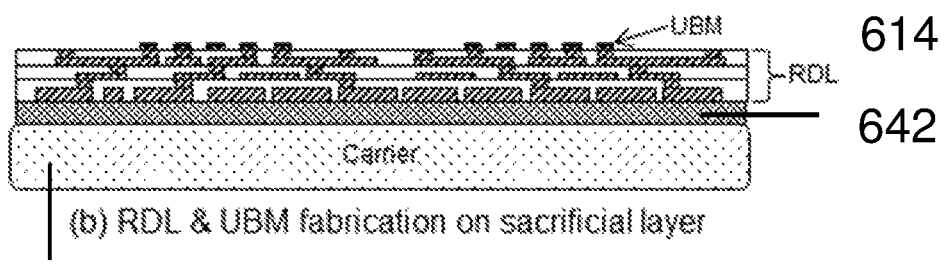
FIG. 6B shows forming of a first redistribution layer on or over the sacrificial layer according to various embodiments.

FIG. 6A shows forming a sacrificial layer 642 on or over a carrier 640 according to various embodiments. FIG. 6B shows forming of a first redistribution layer 614 on or over the sacrificial layer 642 according to various embodiments. Underbump (UBM) metallization may be formed on the sacrificial layer 642 using a semi-additive process. The remaining of the first redistribution layer 614 may be formed on or over the underbump metallization. The first redistribution layer 614 may include one or more layers of metallizations. The first redistribution layer 614 may further include one or more dielectric layers including a suitable dielectric material. The one or more layers of metallizations may be embedded or covered by the one or more dielectric layers.

Figure 6C:
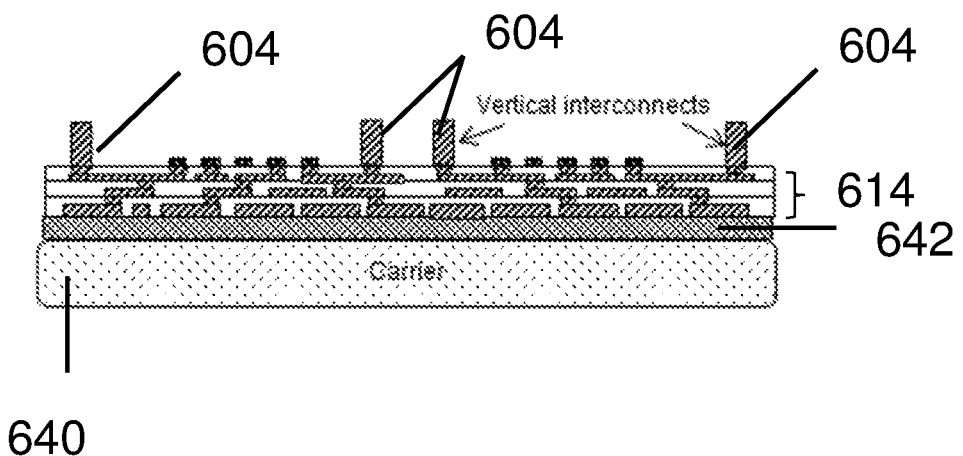
FIG. 6C shows forming one or more interconnect structures according to various embodiments.

FIG. 6C shows forming one or more interconnect structures 604 according to various embodiments. The one or more interconnect structures 604 may be formed on or over the first redistribution layer 614 so that the one or more interconnect structures 604 may extend vertically. The one or more interconnect structures 604 may be in electrical connection with the one or more layers of metallizations in the first redistribution layer 614. The one or more interconnects 604 may be copper (Cu) wires or copper pillars. The one or more interconnects 604 may connect a portion of the top UBM metallization of the first redistribution layer 614.

Figure 6D:
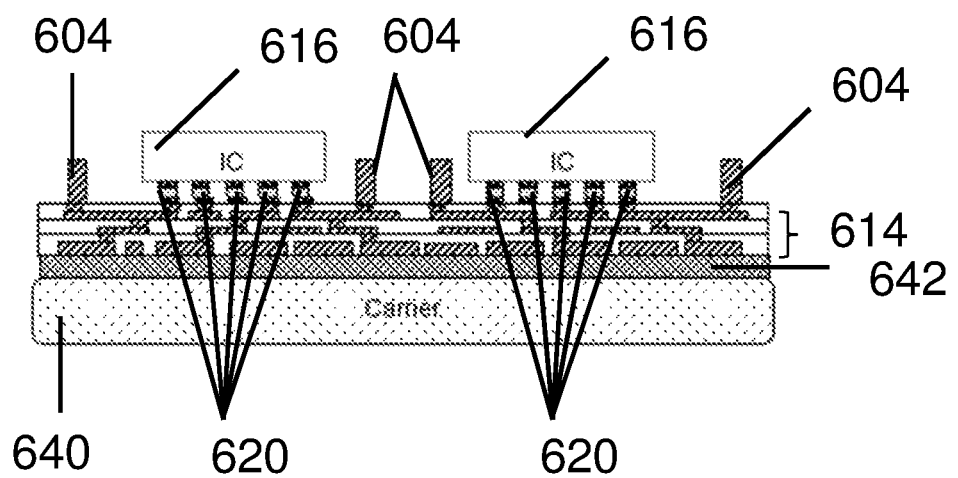
FIG. 6D shows providing one or more semiconductor dice over the first redistribution layer 614 according to various embodiments.

FIG. 6D shows providing one or more semiconductor dice 616 over the first redistribution layer 614 according to various embodiments. The one or more semiconductor dice 616 (e.g. integrated circuit (IC) chips) may be in electrically connected to the first redistribution layer 614, i.e. to the metallization layers of the first redistribution layer 614 via one or more solder bumps 620. The one or more solder bumps 620 may be reflowed to attach the one or more semiconductor dice 616 to the first redistribution layer 614.

Figure 6E:
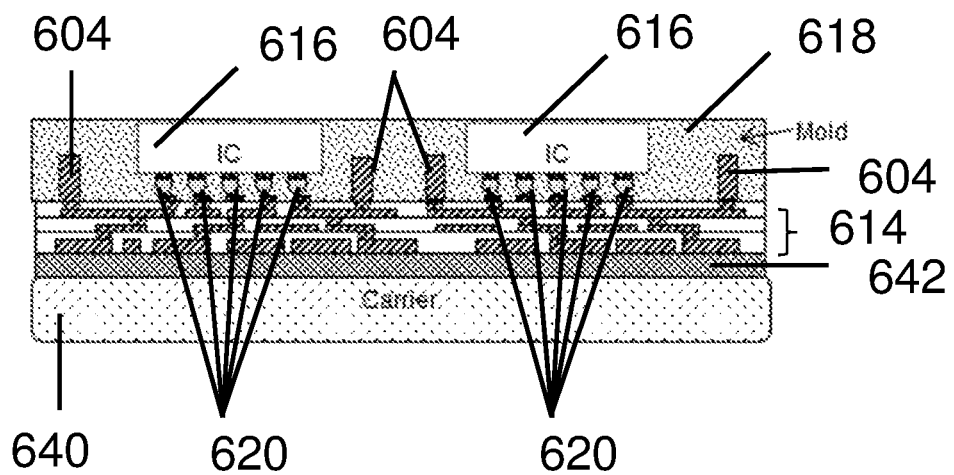
FIG. 6E shows forming the first mold encapsulation structure according to various embodiments.

FIG. 6E shows forming the first mold encapsulation structure 618 according to various embodiments. The first mold encapsulation structure 618 may cover or encapsulate the one or more semiconductor dice 616. The first mold encapsulation structure 618 may further cover or encapsulate the one or more interconnect structures 604. Forming the first mold encapsulation structure 618 may including depositing a mold epoxy compound on or over the first redistribution layer 614 in a wafer level molding process.

Figure 6F:
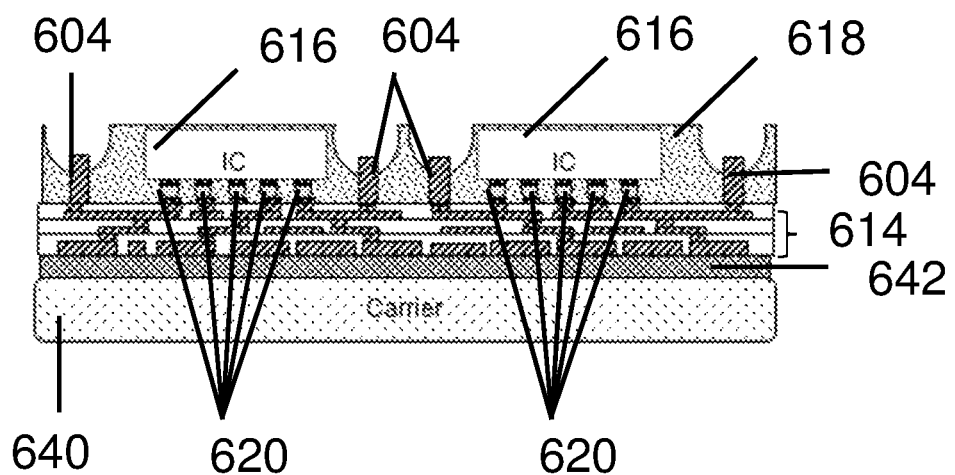
FIG. 6F shows forming cavities on the mold encapsulation structure according to various embodiments.

FIG. 6F shows forming cavities on the mold encapsulation structure 618 according to various embodiments. The cavities may be formed on the exposed surface of the mold encapsulation structure 618 by a suitable method such as laser machining, and may be hemispherical. Further, the formation of the cavities may expose the one or more interconnect structures 604 such that a portion of each of the one or more interconnect structures 604 protrudes into a respective cavity. In various embodiments, an interconnect finishing layer may be formed on the portion of the interconnect structure 604 protruding into the cavity, or/and a cavity finishing layer on at least a portion of the first surface, i.e. exposed surface, defining the cavity.

Figure 6G:
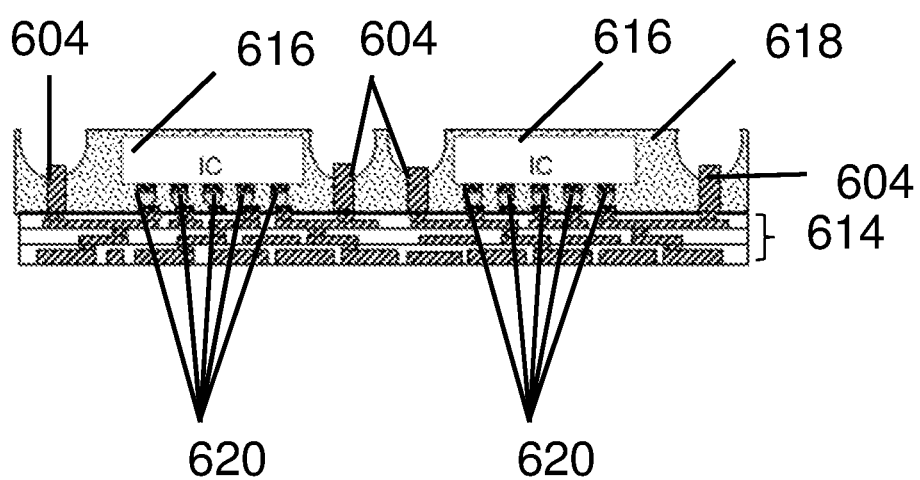
FIG. 6G shows removal of the carrier according to various embodiments.

FIG. 6G shows removal of the carrier 640 according to various embodiments. The carrier 640 may be separated from a molded structure or reconstituted wafer including the first redistribution layer, 614, the one or more semiconductor dice 616 with the one or more solder bumps 620, the encapsulation structure 618, and the one or more interconnect structures 604. The carrier 640 may be separated from the molded structure by debonding of the sacrificial layer 642.

Figure 6H:
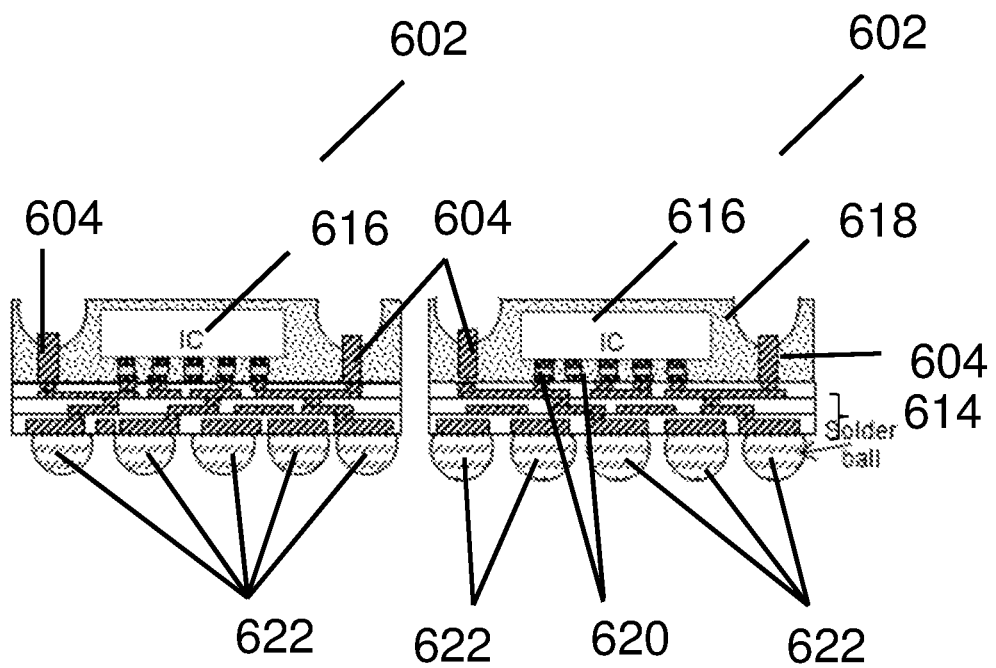
FIG. 6H shows forming of a plurality of solder balls and the singulation of the molded structure according to various embodiments.

FIG. 6H shows forming of a plurality of solder balls 622 and the singulation of the molded structure according to various embodiments. The plurality of solder balls 622 may be attached to the UBMs of the redistribution layer 614 such that the solder balls 622 and the chips 616 are on opposing sides of the redistribution layer 614. The molded structure or the reconstituted wafer may be dice to form single packages 602.

Figure 6I:
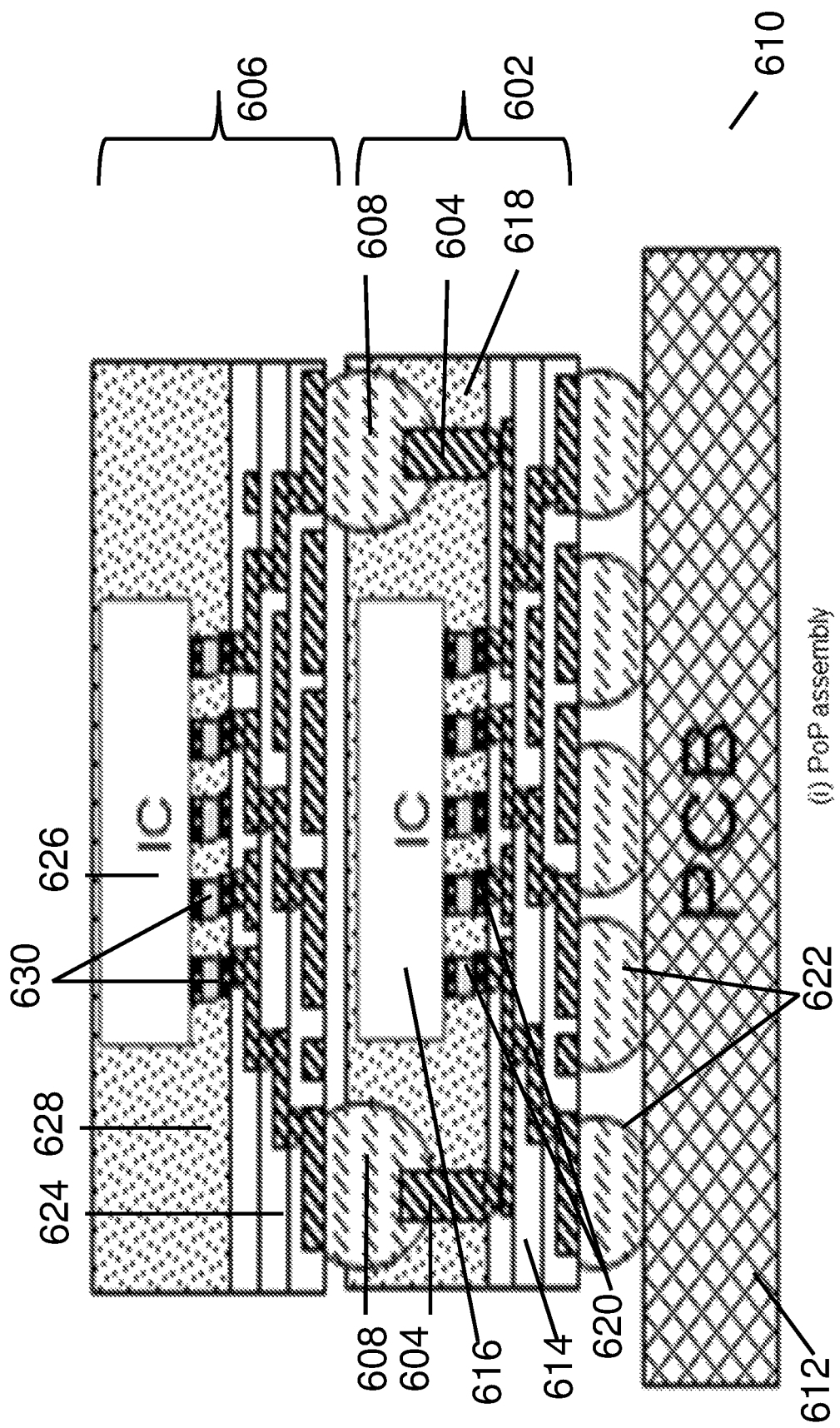
FIG. 6I shows forming a semiconductor package according to various embodiments.

FIG. 6I shows forming a semiconductor package 610 according to various embodiments. A singulated fan-out package 602 shown in FIG. 6H may be assembled onto a printed circuit board (PCB) 612 by reflowing the solder balls 622 to PCB pads. A top package 606 such as another fan-out wafer level package may be stacked above the singulated fan-out package 602. The one or more connection elements or solder balls 608 may be reflowed to the hemispherical cavities of the package 602. The one or more solder balls 608 may form intermetallic joints with the one or more interconnect structures 604 and/or the interconnect finishing layer and/or the cavity finishing layer. The top package 606 may include a second redistribution layer 624, a further semiconductor die 626 connected to the second redistribution layer 624 using one or more solder bumps 630. The further semiconductor die 626 may be encapsulated by a further encapsulation structure 628.

The semiconductor package 610 may be traced using surface electron microscopy (SEM) or cross-sectional electron microscopy.

Various embodiments may have improved ease of integration of vertical interconnects due to lower height of vertical interconnect (Cu pillar or Cu wire) fabrication. The vertical interconnects may be smaller than the thickness of the mold encapsulation structure. Various embodiments involving wire bonding and/or copper pillar process may have less stringent requirements and greater ease of scaling down.

Various embodiments may possess enhanced solder joint reliability due to cavity structure and protruding vertical interconnects. The solder crack path may be diverted to and may be impeded by the protruding vertical interconnect. The vertical interconnect may be Cu material which is mechanically harder than solder and may effectively stop the crack path.

Various embodiments may have a lower package-on-package (PoP) stack height, as the solder balls sit in the cavity. Various embodiments may seek to provide a PoP package including a through mold interconnect (TMI) based structure having a reduced stand-off height. In various embodiments, the gap between the top package and the bottom package may be reduced die to the accommodation of the solder balls of the top package into the hemispherical cavities of the bottom package. In various embodiments, the cavity housing may prevent or reduce solder bump bridging for finer bump pitch.

Various embodiments may not require additional fabrication of through silicon vias and/or embedding of PCB bars.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of forming an electrical connection structure, the method comprising:
   providing a first substrate having a first surface;
   forming a cavity on the first surface;
   forming an inner wall defining a via extending from the cavity;
   forming an interconnect structure in the via so that a portion of the interconnect structure protrudes into the cavity, the interconnect structure being any one structure selected from a group consisting of a pillar and a wire;
   providing a second substrate having a second surface facing the first surface; and
   forming a connection element on the second surface;
   wherein at least a portion of the connection element is received in the cavity so that the connection element is in electrical connection with the interconnect structure; and
   wherein the cavity is a hemispherical cavity.

2. The method according to claim 1, wherein the cavity is formed after forming the interconnect structure.

3. The method according to claim 1, further comprising:
   forming an interconnect finishing layer on the portion of the interconnect structure protruding into the cavity by using one of electroless plating and immersion plating.

4. The method according to claim 1, further comprising:
   forming a cavity finishing layer on at least a portion of the first surface defining the cavity by using at least one of sputtering and plating.

* * * * *